(12) United States Patent
Creeden (10) Patent No.: US 11,158,990 B2
(45) Date of Patent: Oct. 26, 2021

(54) OPTICAL FIBER AMPLIFIER SYSTEM AND METHODS OF USING SAME

(71) Applicant: Nufern, East Granby, CT (US)

(72) Inventor: Daniel J. Creeden, Bloomfield, CT (US)

(73) Assignee: Nufern, East Granby, CT (US)

(*) Notice: Subject to any disclaimer, the term of this patent is extended or adjusted under 35 U.S.C. 154(b) by 0 days.

(21) Appl. No.: 16/352,646

(22) Filed: Mar. 13, 2019

(65) Prior Publication Data
US 2019/0288477 A1  Sep. 19, 2019

Related U.S. Application Data

(60) Provisional application No. 62/642,571, filed on Mar. 13, 2018.

(51) Int. Cl.
| | |
|---|---|
| *H01S 3/094* | (2006.01) |
| *H01S 3/04* | (2006.01) |
| *H01S 3/067* | (2006.01) |
| *H01S 5/068* | (2006.01) |
| *H01S 3/102* | (2006.01) |
| *H01S 5/14* | (2006.01) |
| *H01S 3/16* | (2006.01) |

(52) U.S. Cl.
CPC .......... *H01S 3/094003* (2013.01); *H01S 3/04* (2013.01); *H01S 3/067* (2013.01);
(Continued)

(58) Field of Classification Search
CPC .......... H01S 3/094003; H01S 5/06804; H01S 3/067; H01S 3/1022; H01S 3/04; H01S 3/06754
See application file for complete search history.

(56) References Cited

U.S. PATENT DOCUMENTS

| | | | |
|---|---|---|---|
| 2006/0146892 A1* | 7/2006 | Hoffman | H01S 3/10015 372/6 |
| 2006/0257150 A1* | 11/2006 | Tsuchiya | H04J 14/02 398/79 |

(Continued)

FOREIGN PATENT DOCUMENTS

| | | |
|---|---|---|
| EP | 2458695 A1 | 5/2012 |
| EP | 2555352 A1 | 2/2013 |
| WO | 2018037413 A1 | 3/2018 |

OTHER PUBLICATIONS

International Search Report and Written Opinion, International Patent Application No. PCT/US2019/022131, dated Feb. 7, 2019.

*Primary Examiner* — Yuanda Zhang
(74) *Attorney, Agent, or Firm* — McDonnell Boehnen Hulbert & Berghoff LLP (57) ABSTRACT

The present disclosure relates to optical fiber amplifying systems having operability at a wide variety of ambient temperatures and to methods for using them. One aspect of the disclosure is an optical fiber system configured to provide amplified radiation. The system includes an active optical fiber; a plurality of grating-locked pump sources, each having an output optically coupled to the active optical fiber; one or more temperature sensors, configured to measure a temperature associated with one or more of the grating-locked pump sources; and a control system configured to accept measurements from the one or more temperature sensors and, for a desired total pump power output, to provide to one or more of the grating-locked pump sources a set of drive currents suitable to provide the desired total pump power output.

23 Claims, 6 Drawing Sheets

(52) U.S. Cl.
CPC ...... *H01S 3/06754* (2013.01); *H01S 3/09408* (2013.01); *H01S 3/1022* (2013.01); *H01S 5/06804* (2013.01); *H01S 5/141* (2013.01); H01S 3/0675 (2013.01); H01S 3/094011 (2013.01); *H01S 3/1618* (2013.01); *H01S 5/146* (2013.01)

(56) References Cited

U.S. PATENT DOCUMENTS

| | | | | |
|---|---|---|---|---|
| 2008/0192778 | A1* | 8/2008 | Ohsono | G02B 6/02395 |
| | | | | 372/6 |
| 2010/0183040 | A1* | 7/2010 | Ishizu | B23K 26/0622 |
| | | | | 372/25 |
| 2010/0246207 | A1* | 9/2010 | Furuya | G02B 6/001 |
| | | | | 362/553 |
| 2011/0150026 | A1 | 6/2011 | Tsunekane | |
| 2012/0155498 | A1* | 6/2012 | Sakamoto | H01S 3/06754 |
| | | | | 372/6 |
| 2015/0229095 | A1* | 8/2015 | Miyato | H01S 3/0941 |
| | | | | 372/6 |
| 2015/0349481 | A1* | 12/2015 | Kliner | H01S 3/0675 |
| | | | | 359/341.3 |
| 2016/0308328 | A1* | 10/2016 | Sakamoto | H01S 5/4025 |
| 2017/0110847 | A1* | 4/2017 | Kajiwara | H01S 3/1306 |

\* cited by examiner

OPTICAL FIBER AMPLIFIER SYSTEM AND METHODS OF USING SAME

CROSS-REFERENCE TO RELATED APPLICATIONS

This application claims the benefit of priority of U.S. Provisional Patent Application No. 62/642,571, filed Mar. 13, 2018, which is hereby incorporated herein by reference in its entirety.

BACKGROUND OF THE DISCLOSURE

1. Field of the Disclosure

The present disclosure relates generally optical fiber amplifiers. The present disclosure relates more particularly to optical fiber amplifiers having operability at a wide variety of ambient temperatures, and for methods for using them.

2. Technical Background

Optical fiber systems that provide amplified radiation, e.g., in the form of an optical fiber laser, have many attractive properties that make them suitable for various industrial applications. Such properties can include one or more of good beam quality, easy thermal management, compact size, and good efficiency. Fiber lasers are therefore often preferred to conventional types of lasers, such as solid-state and gas lasers. Fiber lasers are able to produce optical output in the several kW range with excellent beam quality. Thus, these lasers can be used for macro-machining applications like welding and cutting of metal. Furthermore, fiber lasers lend themselves for operation with ultra-short pulses by a method of mode-locking, enabling them to be used in micro-machining applications as well.

Multi-stage fiber lasers, for example, with a seed laser and a power amplifier, are able to provide high brightness optical power, near the diffraction limit for the system. But as power increases, so does the physical size, mass, volume and complexity of the laser itself and also that of requisite ancillary equipment. In many applications this volume of equipment can hinder deployment, as space at or near the point of laser use is often limited and/or expensive.

Fiber lasers can suffer from a relatively low range of operating temperatures in the absence of active cooling. Accordingly, conventional systems include some sort of active cooling, such as a liquid-based chiller or a thermoelectric cooler, importantly, in order to keep the pump sources within a relatively narrow temperature range. While such additional equipment can increase the effective operational temperature range of the system, it disadvantageously increases complexity, cost and size of the system.

There remains a need in the art for improvements in optical fiber systems such as amplifiers and lasers that address one or more of these issues.

SUMMARY OF THE DISCLOSURE

In one aspect, the present disclosure provides an optical fiber system configured to provide amplified radiation, the system including
an active optical fiber having an active dopant, an absorption spectrum associated with the active dopant, the active optical fiber having a first end and a second end;
a plurality of grating-locked pump sources arranged to pump the active optical fiber, each grating-locked pump source having a gain bandwidth and a grating having a spectral width, each grating-locked pump source having an output optically coupled to the first end or the second end of the active optical fiber, each grating-locked pump source being configured to output pump radiation having a h spectrum that substantially overlaps with the absorption spectrum associated with the active dopant of the active optical fiber, the pump radiation having a power that depends on a drive current input to the grating-locked pump source;
one or more temperature sensors, configured to measure a temperature associated with one or more of the grating-locked pump sources; and
a control system configured to accept measurements from the one or more temperature sensors and, for a desired total pump power output, to provide to one or more of the grating-locked pump sources a set of drive currents suitable to provide the desired total pump power output, wherein for each of the one or more pump sources to which current is to be provided, the drive current is controllable such that, based on the measured temperature associated with that pump source,
the gain bandwidth of the grating-locked pump source remains in substantial overlap with the spectral width of the grating, and
the pump radiation output by the pump source has a spectrum that substantially overlaps with the absorption spectrum associated with the active dopant of the active optical fiber.

Another aspect of the disclosure provides a method for providing amplified radiation from an optical fiber system including an active optical fiber having an active dopant and a plurality of grating-locked pump sources arranged to pump the optical fiber (for example, using an optical fiber system as described herein), said method including
providing a total pump power to the active optical fiber by measuring a temperature associated with each of one or more of the grating-locked pump sources; and
for each of the one or more grating-locked pumped sources, based on the measured temperature associated with that pump source, providing a drive current (e.g., using a control system of the optical fiber system) to the grating-locked pump source, the drive current being selected such that
the gain bandwidth of the grating-locked remains in substantial overlap with the spectral width of the grating, and
the pump radiation output by the pump source has a spectrum that substantially overlaps with the absorption spectrum associated with the active dopant of the active optical fiber,
wherein the set of drive currents are selected to provide the total pump power to the active optical fiber from the one or more grating-locked pump sources; and
amplifying radiation in the active optical fiber to provide the amplified radiation.

Additional aspects of the disclosure will be evident from the disclosure herein.

BRIEF DESCRIPTION OF THE DRAWINGS

The accompanying drawings are included to provide a further understanding of the methods and devices of the disclosure, and are incorporated in and constitute a part of this specification. The drawings are not necessarily to scale, and sizes of various elements may be distorted for clarity. The drawings illustrate one or more embodiment(s) of the disclosure, and together with the description serve to explain the principles and operation of the disclosure.

DETAILED DESCRIPTION

The present inventors have noted that one problem with conventional fiber amplifiers is that conventional pump sources (particularly diode lasers) will exhibit a significant drift in output wavelength spectrum at different ambient temperatures. This is problematic because a significant enough change in temperature of a conventional diode laser can cause its output wavelength spectrum to drift away from the absorption spectrum of the active optical fiber of the fiber amplifier, reducing the efficiency of power generation in the active optical fiber. Thus, conventional systems typically include active cooling, for example, fluid chillers or thermoelectric coolers, configured to maintain the diode lasers in a temperature range in which efficient pumping of the active optical fiber is assured. While this can be effective to provide for operation over a wide variety of ambient temperatures, it adds significant complexity, mass and cost to a fiber amplifier system.

Figure 1:
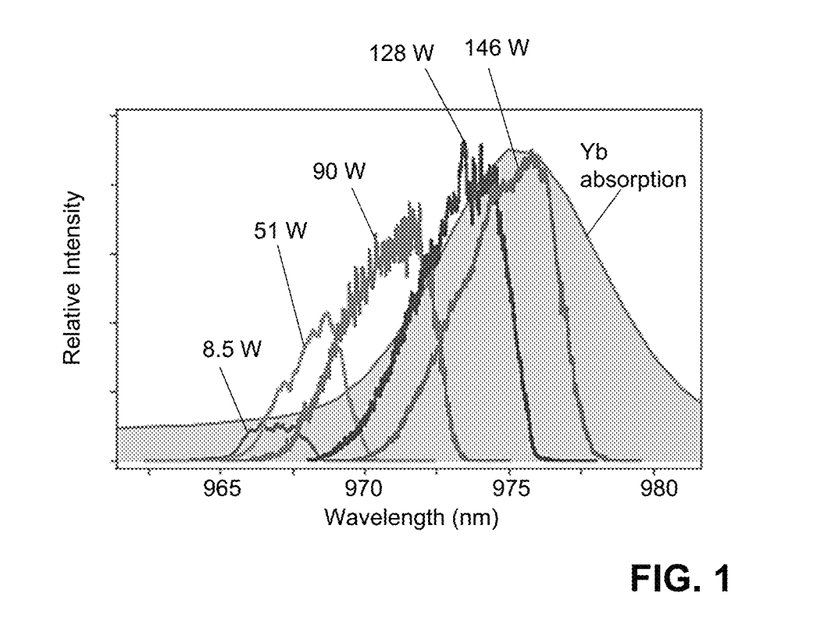
FIG. 1 is a graph comparing the output spectrum of a conventional diode laser as a function of drive current, overlaid with the absorption spectrum of the active ytterbium ions of a ytterbium-doped active optical fiber, at a constant 20° C. diode baseplate temperature.
Figure 2:
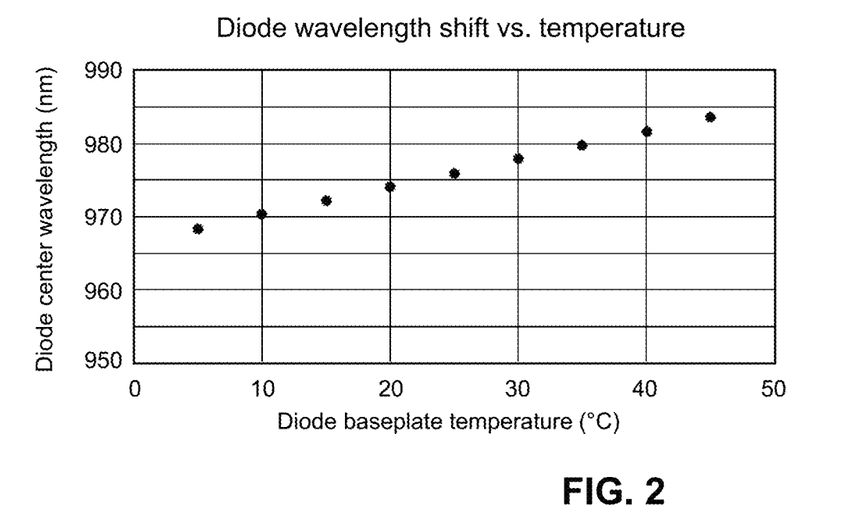
FIG. 2 is a graph comparing the peak output wavelength of a conventional diode laser as a function of diode baseplate temperature at constant drive current.
Figure 3:
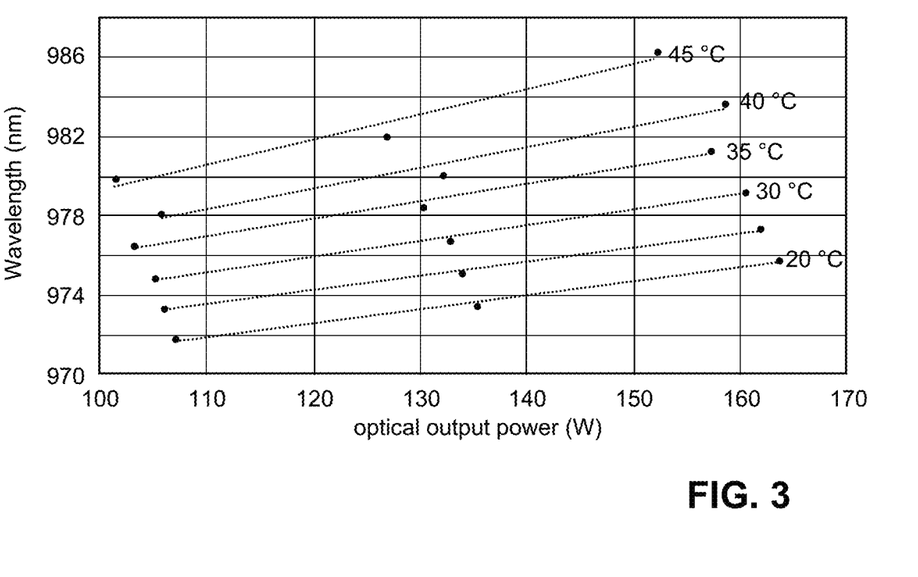
FIG. 3 is a graph showing peak output wavelength of a conventional diode laser as a function of output power (drive currents 8, 10 and 12 A) at various diode baseplate temperatures.

The performance of a diode laser depends strongly on the junction temperature, i.e., the temperature at the active junction of the diode laser. This, in turn, will depend chiefly on the ambient temperature adjacent the diode laser, and the drive current driving the diode laser. FIG. 1 is a graph comparing the output spectrum of a conventional diode laser as a function of drive current, overlaid with the absorption spectrum of the active ytterbium ions (Yb) of a ytterbium-doped active optical fiber, at a constant 20° C. diode baseplate temperature. While at high drive current (and thus high output power) the output of this diode laser has good spectral overlap with the ytterbium absorption band at about 975 nm, as the drive current decreases, the overlap with the ytterbium absorption band decreases. A change in temperature of the device overall will likewise cause a spectral shift in output of the diode, with higher temperatures causing a red-shift of the output radiation, and lower temperatures causing a blue-shift of the output radiation. FIG. 2 is a graph comparing the peak output wavelength of a conventional diode laser as a function of diode baseplate temperature at constant drive current. These spectral shifts can cause a conventional diode laser to drift away from the absorption band of the active optical fiber, and thus cause a loss of efficiency or even a loss of function of the amplifier overall. This can be an especially important effect when temperature and drive current both increase or decrease combination. FIG. 3 is a graph showing peak output wavelength of a conventional diode laser as a function of output power (drive currents 8, 10 and 12 A) at various diode baseplate temperatures, demonstrating a 14 nm wavelength shift between 107 W at 20° C. and 155 W at 45° C.

Figure 4:
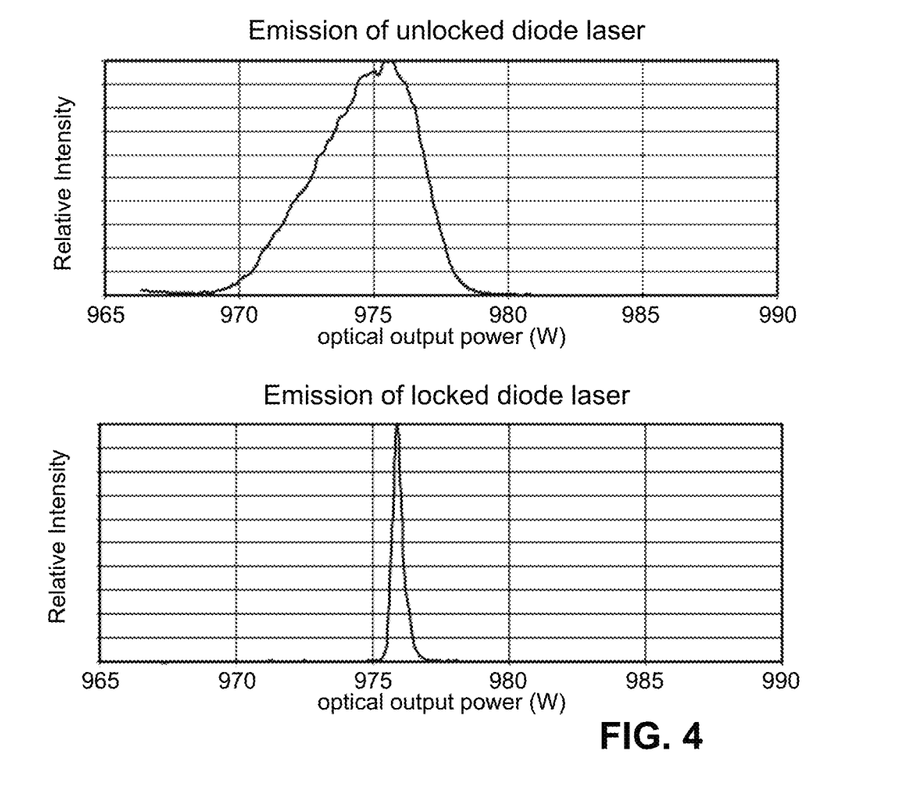
FIG. 4 is a set of graphs comparing the output spectrum of an unlocked diode with the output spectrum of a volume Bragg grating-locked diode laser.

To increase the effective temperature and power range of a diode laser, it is possible to lock the output wavelength by use of a grating acting as a wavelength-selective cavity mirror for the diode laser. A variety of such gratings are suitable for use in a grating-locked diode laser, such as volume Bragg gratings, fiber Bragg gratings and narrow-linewidth interference reflectors. Advantageously, while a diode has a relatively significant thermal shift, e.g., a thermal spectral shift typically on the order of 0.3-0.4 nm/° C., the center wavelength of a grating is much more invariant with temperature. So while the gain bandwidth of a diode will shift with temperature, as long as it significantly overlaps the spectral width of the grating, the diode laser will function with a narrow spectral output. FIG. 4 is a set of graphs comparing the output spectrum of an unlocked diode with the output spectrum of a volume Bragg grating-locked diode.

Figure 5:
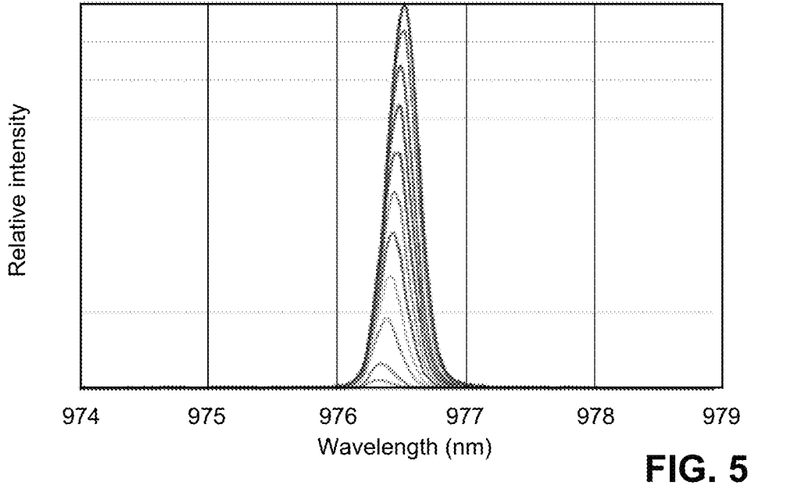
FIG. 5 is a graph showing the output spectrum of a volume-Bragg grating-locked diode laser at a variety of drive currents.

And as the center wavelength of a grating does not shift much with temperature, grating-locked diodes can have a very low thermal spectral shift, e.g., on the order of 0.03 nm/° C. FIG. 5 is a graph showing the output spectrum of a volume-Bragg grating-locked diode laser (150 W Coherent/Dilas PM16 VBG-locked diode) at a variety of drive currents (i.e., and thus a variety of junction temperatures). The temperature change due to electrical resistance of the diode junction in the diode laser of FIG. 5 is about 0.15° C./W. At 10 A of drive current, there is about 125 W of output power and the junction temperature is about 18.75° C. higher than that of the surroundings (e.g., a baseplate on which it is disposed). At only 2 A of drive current, there is about 20 W of output power and the junction temperature would be about 3° C. higher than that of the surroundings. Thus, while the underlying diode gain bandwidth has a significant thermal shift, there is relatively little creep in the output spectrum of the grating-locked device. FIG. 5 does demonstrate a very minor degree of wavelength shift with current (i.e., and thus junction temperature) for the locked signal, but this shift is typically not enough to be problematic.

Figure 5A:
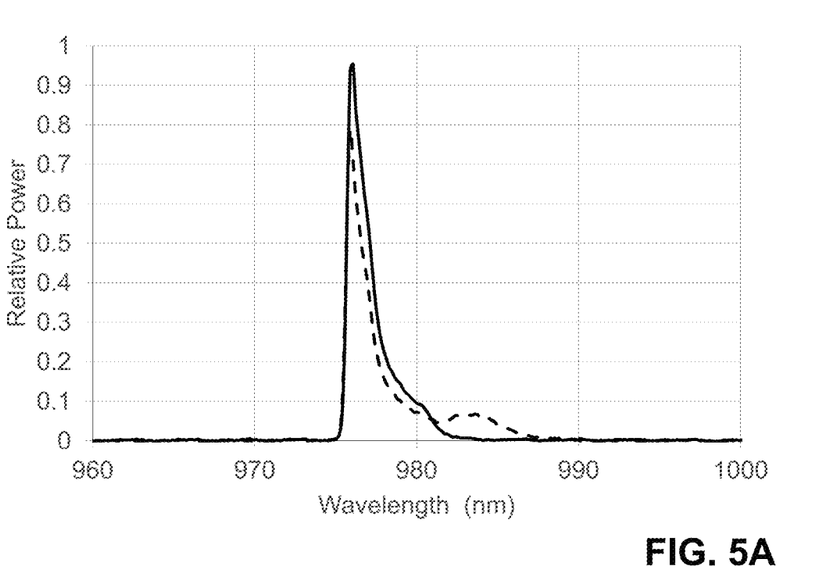
FIG. 5A is a graph showing the output spectrum of a grating-locked diode laser at 20° C. (solid line) and 45° C. (dashed line).

There can be, however, a significant portion of the diode laser output that is unlocked, especially as the temperature shifts from a nominal operating temperature. For example, FIG. 5A is a graph showing the output of a grating-locked diode laser at 20° C. (solid line) and 45° C. (dashed line). Notably, at 45° C., there is a significant amount of power outside the locked wavelength range of the main peak. Such unlocked output can fall outside the absorption bandwidth of the active optical fiber. This can result in a substantial lower efficiency of the overall system. Moreover, as the unlocked output is not absorbed by the active optical fiber, if not stripped from the system it can end up co-propagating with the amplified radiation output from the system. Typically, unlocked radiation is stripped by a mode stripper; this is workable but the thermal stress on the mode stripper can provide another failure point to the system.

The present inventors have determined that drive current can be adjusted based on a measured temperature associated with a grating-locked diode laser in order to maintain the desired spectral performance of a grating-locked diode laser in general, and of its underlying diode in particular. Such control of the drive current can effectively control the junction temperature against changes in overall temperature of the grating-locked diode laser, e.g., caused by changes in ambient temperature. Some combinations of drive current and ambient temperature may not provide the desired performance, e.g., a high drive current at a high ambient temperature may cause a significant portion of the diode-laser output to be unlocked. As high drive currents relate to high powers, this means that at high ambient temperatures a grating-locked diode laser may not be able to run at full power. This can be remedied by including additional diode lasers in the system than might not otherwise be required. Critically, the present inventors have determined that such control of the drive current based on a measured temperature can provide for operation of an optical amplification system over a wide range of ambient temperatures without the need for active temperature control.

Figure 6:
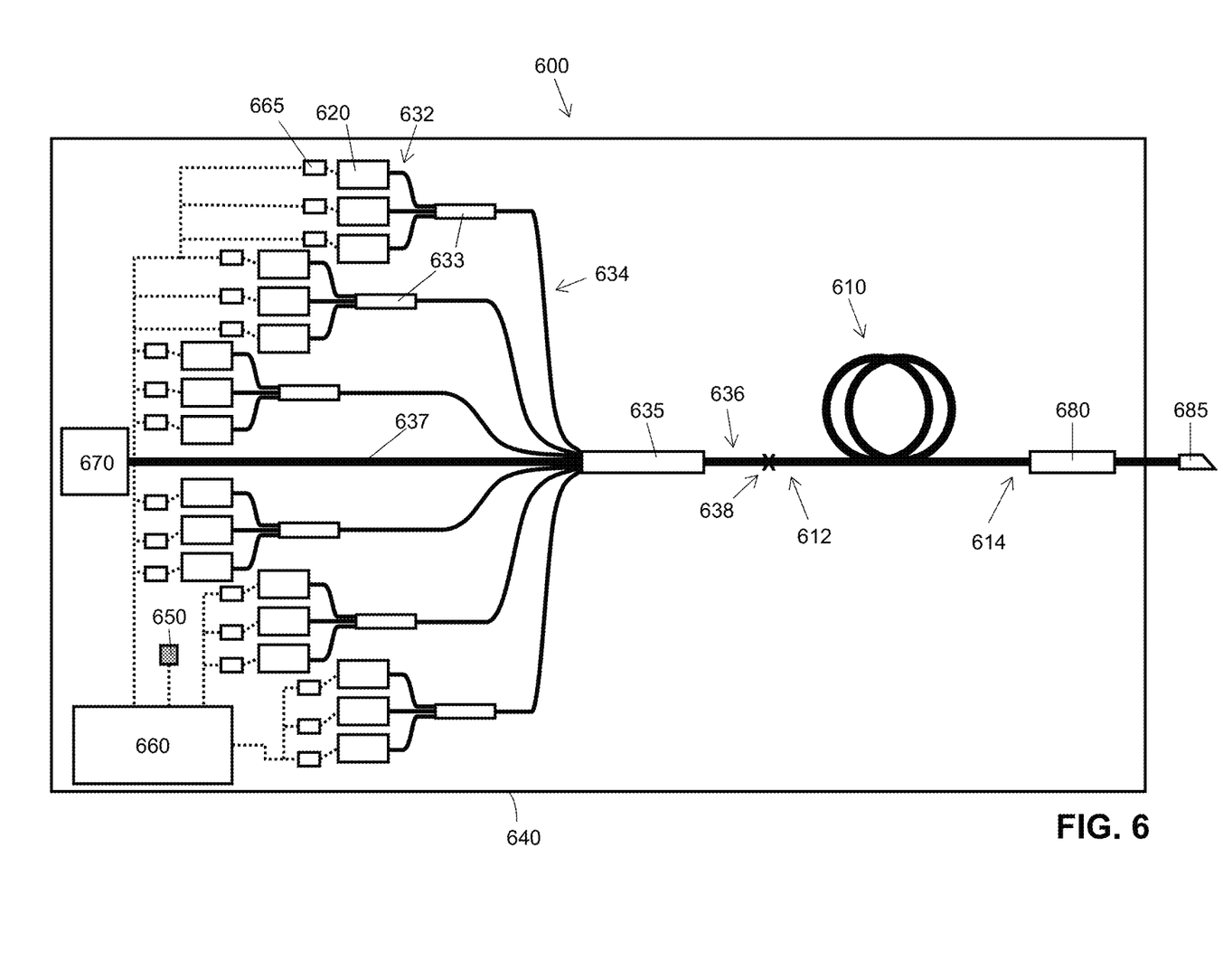
FIG. 6 is a schematic view of an optical fiber amplifier according to one embodiment of the disclosure.

One embodiment of the present disclosure is shown in schematic view in FIG. 6. Optical fiber system 600 (here, configured as an amplifier) includes an active optical fiber 610 having an active dopant, an absorption spectrum associated with the active dopant, and an emission wavelength. The active optical fiber 610 has a first end 612 and a second end 614. Also included are a plurality of grating-locked diode lasers 620, each grating-locked diode laser having a diode emitter having a gain bandwidth and a grating reflectively coupled to the diode emitter, the grating having a spectral width. As described above, the use of the grating can significantly narrow and stabilize the wavelength of the radiation emitted by the grating-locked diode laser. Each grating-locked diode laser 620 is optically coupled to the first end 612 or the second end 614 of the active optical fiber.

In the embodiment of FIG. 6 the system is configured as a fiber amplifier without a resonator configured for multi-pass amplification through the active optical fiber. The person of ordinary skill in the art will appreciate that the systems herein can alternatively be configured with a resonator formed to allow for multi-pass amplification, e.g., through the use of fiber Bragg gratings as is conventional.

In the embodiment of FIG. 6, the diode lasers 620 are optically coupled to the first end 612 of the active optical fiber 610 through optical fibers 632, 3×1 couplers 633, optical fibers 634, (6+1)×1 coupler 635, and optical fiber 636, which is coupled to the first end 612 of the active optical fiber by splice 638 (e.g., an air-guided splice). Notably, each diode laser is configured to output pump radiation having a spectrum that substantially overlaps with the absorption spectrum associated with the active dopant of the active optical fiber. As used herein, the output pump radiation has a spectrum that substantially overlaps with the absorption spectrum associated with the active dopant of the active optical fiber when the full-width-at-half-maximum wavelength range of the output pump radiation is within the full-width-at-quarter-maximum wavelength range of the absorption spectrum associated with the active dopant of the active optical fiber. In certain desirable embodiments of the methods and processes as otherwise described herein, such "substantial overlap" requires that the full-width-at-half-maximum wavelength range of the output pump radiation is within the full-width-at-1/e maximum wavelength range of the absorption spectrum associated with the active dopant of the active optical fiber. In certain especially desirable embodiments of the methods and processes as otherwise described herein, such "substantial overlap" requires that the full-width-at-half-maximum wavelength range of the output pump radiation is within the full-width-at-half maximum wavelength range of the absorption spectrum associated with the active dopant of the active optical fiber. As described above, the pump radiation of each diode laser has a power that depends on a drive current input thereto.

System 600 also includes one or more temperature sensors, configured to measure a temperature associated with each of the diode lasers. In the embodiment of FIG. 6, each of the diode lasers is disposed on a baseplate 640, and temperature sensor 650 is disposed to measure the temperature of the plate 640. In this embodiment, the baseplate is not actively cooled, and so will reflect the ambient temperature experienced by the diode lasers. However, as described in more detail below, a variety of temperature measurement configurations can be used.

System 600 also includes a control system configured to accept temperature measurements from the one or more temperature sensors and, for a desired total pump power output, to provide to one or more of the diode lasers a set of drive currents suitable to provide the desired total pump power output. For each of the one or more diode lasers to which current is to be provided, the drive current is controllable such that, based on the measured temperature associated with that diode lasers, the gain bandwidth of the diode emitter remains in substantial overlap with the spectral width of the grating, and the pump radiation output by the diode laser has a spectrum that substantially overlaps with the absorption spectrum associated with the active dopant of the active optical fiber. As used herein, the gain bandwidth of the diode laser remains in substantial overlap with the spectral width of the grating when the full-width-at-half-maximum wavelength range of the spectral width of the grating is within the full-width-at-quarter-maximum wavelength range of the gain bandwidth of the diode laser. In certain desirable embodiments of the method and systems as described herein, such "substantial overlap" requires that the full-width-at-half-maximum wavelength range of the spectral width of the grating is within the full-width-at-1/e-maximum wavelength range of the gain bandwidth of the diode laser. In certain especially desirable embodiments of the method and systems as described herein, such "substantial overlap" requires that the full-width-at-half-maximum wavelength range of the spectral width of the grating is within the full-width-at-half maximum wavelength range of the gain bandwidth of the diode emitter. For example, in the embodiment of FIG. 6, the control system includes a controller 660 and a plurality of diode drivers 665. The controller is configured to accept temperature measurements from the one or more temperature sensors, and, for a desired pump power output, determines a set of drive currents for one or more of the grating-locked diode lasers suitable to provide the desired total pump power output, and causes the diode drivers 655 associated with those diode lasers to provide the current thereto.

Moreover, based on the present disclosure the person of ordinary skill in the art will appreciate that the amount of unlocked power from a grating-locked diode laser is a function of both temperature and drive current. In the methods and systems described herein, drive currents can be selected based on temperature to help ensure that a relatively low amount of unlocked power (especially unlocked power falling outside the absorption band of the active optical fiber) is emitted from the diode laser. Accordingly, in certain embodiments of the systems and methods as otherwise described herein, less than 10% of the power emitted from the diode laser is outside the full-width-at-quarter-maximum wavelength range of the absorption bandwidth of the active optical fiber. In certain such embodiments, less than 5%, less than 2% or even less than 1% of the power emitted from the diode laser is outside the full-width-at-quarter-maximum wavelength range of the absorption bandwidth of the active optical fiber. In certain such embodiments, less than 10% (e.g., less than 5%, less than 2% or even less than 1%) of the power emitted from the diode laser is outside the full-width-at-1/e-maximum wavelength range of the absorption bandwidth of the active optical fiber. In certain such embodiments, less than 10% (e.g., less than 5%, less than 2% or even less than 1%) of the power emitted from the diode laser is outside the full-width-at-half-maximum wavelength range of the absorption bandwidth of the active optical fiber.

A variety of particular embodiments of such optical amplification systems are described in more detail below.

Another aspect of the disclosure is a method for providing amplified radiation. The method includes providing an system as described herein (e.g., in any embodiment); providing a total pump power to the active optical fiber by measuring a temperature associated with each of one or more of the grating-locked diode lasers; and for each of the one or more diode lasers, based on the measured temperature associated with that diode laser, providing a drive current to the diode laser, the drive current being selected such that the gain bandwidth of the diode laser remains in substantial overlap with the spectral width of the grating, and the pump radiation output by the diode laser has a spectrum that substantially overlaps with the absorption spectrum associated with the active dopant of the active optical fiber, wherein the set of drive currents are selected to provide the total pump power to the active optical fiber from the one or more diode lasers; and amplifying radiation in the active optical fiber to provide the amplified radiation. A variety of particular embodiments of such methods are described in more detail below. The person of ordinary skill in the art will appreciate that the control system of the optical fiber systems described herein can be configured to perform such methods.

Figure 7:
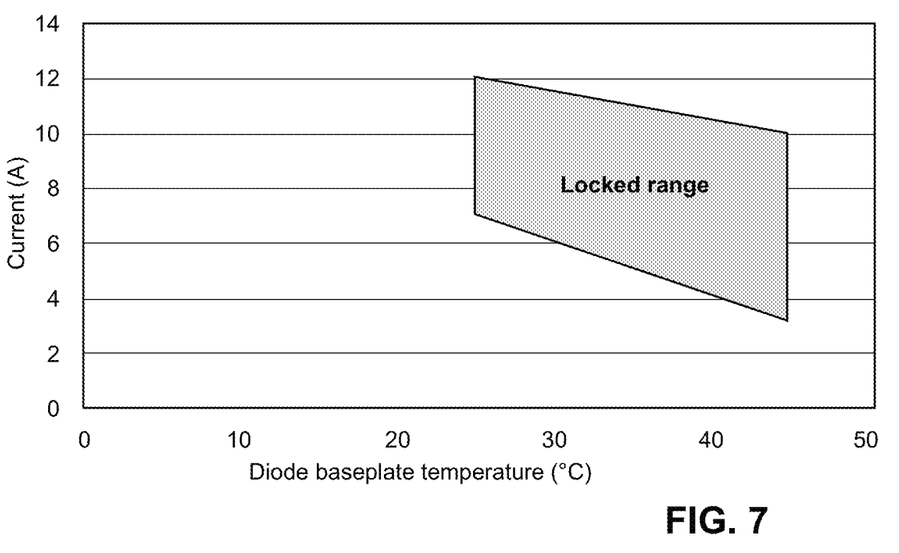
FIG. 7 is a graph showing drive currents at which a grating-locked diode laser wavelength locking over a range of ambient temperatures.

In the amplifiers and methods as described herein, the drive currents used to drive the diode laser can be selected based on the measured temperature(s) associated with the diode lasers (i.e., by a controller configured to do so). Such adjustment may mean that at certain high ambient temperatures, a diode laser cannot be run at high currents, because to do so would cause the underlying diode emission to become red shifted such that a portion of the output of the diode laser becomes unlocked. Similarly, at certain low ambient temperatures, a diode laser cannot be run at low currents, because to do so would cause the underlying diode emission to become blue shifted such that a portion of the output of the diode laser becomes unlocked. FIG. 7 is a graph showing drive currents at which a grating-locked diode laser (150 W Coherent/Dilas PM16 VBG-locked diodes) exhibits wavelength locking over a range of ambient temperatures. Notably, as the ambient temperature increases, the range of currents over which the diode laser will lock (i.e., with acceptable overlap between the diode emission and the spectral width of the grating) shifts to lower ranges of currents.

Accordingly, at high ambient temperatures (e.g., without active cooling), it may not be possible to drive a diode laser at high current (e.g., approaching its maximum rated current). Thus, to flexibly provide a desired high output power over a wide temperature range, it may be necessary to provide more diode lasers than in a corresponding conventional system. Even at reduced currents, at high temperature the diode lasers may not operate at their optimal efficiency. Nonetheless, because there is no need for active cooling, such a configuration has significant advantages.

And at lower ambient temperatures, it may not be possible to drive all of the diode lasers of the system at a low enough current to provide a desired low total pump power. And in any event, it may not be desirable to do so, as diode lasers typically operate more efficiently when driven at relatively higher currents. In certain embodiments of the systems and methods as otherwise described herein, each diode laser that is activated is driven at no-less-than 50% of its maximum rated drive current. Accordingly, in certain embodiments of the methods as otherwise described herein, the method includes, based on the total pump power to be provided to the active optical fiber and the measured temperature(s), determining how many of the diode lasers are to be activated, and providing substantial current only to those diode lasers. Similarly, in the optical fiber amplifiers as otherwise described herein, the controller can be configured to, depending on the measured temperature(s) and the desired total pump power output, determine how many of the diode lasers to activate and to provide substantial current only to those diode lasers. As used herein, "substantial current" refers to current sufficient to cause a diode laser to provide at least 10% of its maximum rated power (in certain embodiments, at least 20% or at least 50%). Accordingly, in certain embodiments of the methods and systems described above, currents of at least 20% (e.g., at least 50%) of the maximum rated power of each diode laser is provided only to the diode laser(s) determined to be activated. In various embodiments as otherwise described herein, a "substantial current" is at least 1 A, at least 0.5 A, or at least 0.1 A. Accordingly, in certain embodiments of the methods and systems described above, currents of at least 1 A, at least 0.5 A, or at least 0.1 A are provided only to the diode laser(s) determined to be activated.

In certain such embodiments, the same diode laser or lasers are not selected each time the system is used as being those to which no current will be provided for low-power total output. The order of which diode lasers to drop out with decreasing total output power can be selected randomly on each use, or instead can be preselected and rotated through. In other embodiments, the controller can record the historical usage of each diode laser, and preferentially select the most-used diode lasers when diode lasers are to be dropped out. Dropping out different diode lasers in different instances of use of the optical fiber system can improve total overall system lifetime, as it can avoid using any one of the diode lasers substantially more than others.

The control system can be implemented in any combination of hardware and software, as would be apparent to the person of ordinary skill in the art. For example, as in the embodiment of FIG. 6, the control system can include one or more current drivers configured to provide current, and a controller configured to control the one or more current drivers. As the person of ordinary skill in the art will appreciate, stand-alone laser diode drivers suitable for use as current drivers in the systems described herein are well known in the art and are commercially available from a number of sources. In other embodiments, the current drivers can be integrated together with the controller in the same circuit or enclosure. The controller can be implemented in a variety of fashions, e.g., as a processor programmed to perform the functions described herein. The processor can be part of a general-purpose computer, or can be a stand-alone programmable processor, integrated with a user interface as is conventional in the art. The person of ordinary skill in the art is familiar with controllers and control systems used in optical fiber amplifiers and can modify conventional control systems and controllers for use in the systems and methods described herein.

As described above, the optical fiber amplifiers described herein include one or more temperature sensors, configured to measure a temperature associated with each of the diode lasers, and the methods described herein include measuring a temperature associated with each of one or more of the diode lasers. As used herein, "a temperature associated with a pump source" is a temperature that relates to the temperature of the immediate environment of the pump source. This measured temperature can be correlated with drive current for a particular diode laser to determine the current range over which the diode laser will adequately lock wavelength. The person of ordinary skill in the art will appreciate, based on the description herein, that the temperature sensor(s) and measurement(s) can be configured in a variety of ways. For example, as described with respect to FIG. 6, the system can include a single temperature sensor, configured to perform a single temperature measurement. As in FIG. 6, this can be measured on a baseplate (e.g., acting as a heat sink) on which the diode lasers are disposed. A single temperature sensor/measurement can be adequate when the system design and usage is such that it is reasonable to treat all diode lasers as nominally being at the same temperature, e.g., as when their thermal environments are substantially identical, or when the system is designed not to operate the diode lasers at the extremes of their temperature ranges. Temperature measurements can be taken at other places, e.g., on a diode laser package, otherwise in an area of the system adjacent the diode laser, or even in an area outside but adjacent the amplifier package. In other embodiments, multiple temperature sensors/measurements can be provided, e.g., in different parts of the system to account for different thermal environments in each. Accordingly, different sensors and temperature measurements can be associated with different diode lasers (e.g., a given sensor being associated with a single diode laser, or a group of diode lasers). When there are different temperatures measured for various of the diode lasers, such diode lasers can be driven at different currents, each selected to maintain locking performance of the respective diode lasers(s).

While the sensors and measurements are described as being "temperature" sensors and measurements, the person of ordinary skill in the art will appreciate that the actual signal passed to the control system need not be provided in terms of temperature, but instead can relate to a thermistor resistance or some other signal correlated with temperature. The control system can be configured to treat these signals as a measured temperature as described herein.

Figure 8:
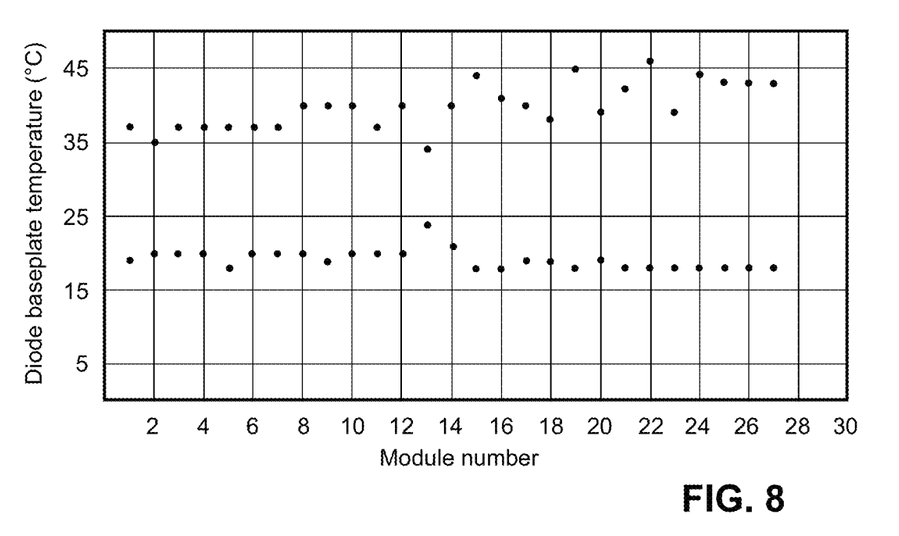
FIG. 8 is a graph of wavelength locking temperature ranges (i.e., maximum locking temperature and minimum locking temperature) for 27 nominally identical 975 nm grating-locked diode lasers taken at constant 12 A current.

In real world systems, even when two grating-locked diode lasers are nominally the same, they may have different ambient temperature ranges over which they adequately lock. As an example, wavelength locking temperature ranges (i.e., maximum locking temperature and minimum locking temperature) for 27 nominally identical 975 nm grating-locked diode lasers (150 W Coherent/Dilas PM16 VBG-locked diodes) taken at constant 12 A current are shown in the graph of FIG. 8. Notably, there can be a substantial difference in operating temperature ranges even for diode lasers that are nominally the same. Accordingly, in certain embodiments of the methods and systems as otherwise described herein, different diode lasers can be provided different currents even when the temperatures associated therewith are the same. The person of ordinary skill in the art can determine the appropriate temperature ranges for each of the diode lasers at a variety of temperatures, and program the control system and/or perform the methods accordingly.

Advantageously, the present inventors have determined that the systems and methods described herein can be configured without active cooling of the grating-locked diode lasers, or with substantially reduced cooling of the grating-locked diode lasers. Thus, while a baseplate on which the diode lasers are mounted might provide some degree of heat sinking, in certain embodiments of the systems as described herein, there is no thermoelectric chiller in substantial thermal contact with the grating-locked diode lasers, and/or no liquid chiller (i.e., using a flow of water or other liquid) in substantial thermal contact with the grating-locked diode lasers. While in some embodiments as otherwise described herein there can be cooling by a flow of air (e.g., caused by a fan), in other embodiments there is no substantial airflow in substantial thermal contact with the one or more grating-locked diode lasers.

The methods and systems described herein can be advantageous even in cases where active cooling is provided. In some cases, "passive cooling" (e.g., conduction, convection, radiation) may not be sufficient. The methods and systems describe herein can have much reduced cooling requirements, and thus require active cooling with much lower heat-transfer capacity as compared to comparable conventional systems. For example, when using the methods and systems as described herein, a less efficient cooling system can be used than would otherwise be necessary for a given output power rating. Rather than having a cooling system sized to the overall heat load, an undersized chiller or pump can be used. Alternatively, one could operate a chiller at a significantly elevated temperature (e.g., compared to room temperature), meaning that there would be less of a requirement to cool the recirculating fluid. Similarly, a different type of system may be used, e.g., thermoelectric coolers or a fan instead of a liquid cooling system. Even with less efficient cooling, as long as the drive currents are selected as described herein, the system will operate. Because this can entail running at higher overall diode temperatures, the overall lifetime of the amplifier may be decreased. Moreover, with less efficient cooling, run-time of the laser may also be decreased. While it is possible to operate over a large temperature range, at some point heat may build up in the system to a point that even reducing the drive currents may not allow the system to operate. At such point, it would be necessary to reduce power or even shut down to allow the system to cool. But many systems do not require 100% on time; especially in such cases, the systems and methods described herein can significantly reduce the requirements of the thermal management system.

As described above with respect to FIG. 7, a grating-locked pump diode can have a substantially different range of drive currents for which it will exhibit wavelength locking at different temperatures. Accordingly, in certain desirable embodiments of the optical fiber amplifiers as described herein, for each of the grating-locked diode lasers, the control system is configured to provide a first range of drive currents to the grating-locked diode laser at a first measured temperature, and to provide a second range of drive currents to the grating-locked diode laser at a second measured temperature 10° C. more than the first measured temperature, the second range of drive currents being substantially different from the second range of drive currents (e.g., by having a substantially lower maximum current, a substantially lower minimum current, or both a substantially lower maximum current and a substantially lower minimum current). In other embodiments, of the optical fiber amplifiers as described herein, for each of the grating-locked diode lasers, the control system is configured to provide a first range of drive currents to the grating-locked diode laser at a first measured temperature, and to provide a second range of drive currents to the grating-locked diode laser at a second measured temperature 20° C. more than the first measured temperature, the second range of drive currents being substantially different from the second range of drive currents (e.g., by having a substantially lower maximum current, a substantially lower minimum current, or both a substantially lower maximum current and a substantially lower minimum current). In other embodiments, of the optical fiber amplifiers as described herein, for each of the grating-locked diode lasers, the control system is configured to provide a first range of drive currents to the grating-locked diode laser at a first measured temperature, and to provide a second range of drive currents to the grating-locked diode laser at a second measured temperature 30° C. more than the first measured temperature, the second range of drive currents being substantially different from the second range of drive currents (e.g., by having a substantially lower maximum current, a substantially lower minimum current, or both a substantially lower maximum current and a substantially lower minimum current). In certain such embodiments, a substantially lower current is at least 5% less or even at least 10% less than a comparative current.

Similarly, in certain desirable embodiments of the methods as described herein, the method includes providing drive currents at two different times, with the drive currents being adjusted to adapt for any changes in temperature. The method includes providing a first set of drive currents to a first set of the plurality of diode lasers at a first set of measured temperatures associated with the first set of diode lasers to provide a first total pump power. The method also includes providing a second set of drive currents to a second set of the plurality of diode lasers at a second set of measured temperatures associated with the second set of diode lasers to provide a second total pump power substantially the same as the first total pump power. The person of ordinary skill in the art will appreciate that the first set of diode lasers can have diode lasers in common with the second set of diode lasers; in fact, they can include the identical selection of diode lasers. One or more of the second set of measured temperatures is at least 5° C. greater (e.g., at least 10° C. greater, at least 20° C. greater, or even at least 30° C. greater) than the corresponding temperatures of first set of measured temperatures, and the first set of drive currents is substantially different from the second set of drive currents. In certain such embodiments, one or more of (e.g., each of) the drive currents of the first set of drive currents is substantially lower than the drive currents of the second set of drive currents. Each substantially lower current can be, for example, at least 5% less or even at least 10% less than a comparative current. In other such embodiments, there are fewer diode lasers having drive current supplied thereto in the first set of diode lasers than in the second set of diode lasers. The providing of the first set of drive currents and the second set of drive currents can be performed in any order, for example, with the first set of drive currents being provided before the second set of drive currents (e.g., to account for an increase in measured temperature(s)), or instead with the second set of drive currents being provided before the first set of drive currents (e.g., to account for a decrease in measured temperature(s)). In certain such embodiments, a substantially same power is within 10% or even within 5%.

The first set of drive currents and the second set of drive currents can be provided with any desired amount of time in between them, even including a powering off (or several powering offs) of the optical fiber amplifier. For example, in certain embodiments the first set of drive currents and the second set of drive currents are provided within two hours of one another. In such cases, the change in drive currents can be used to compensate for a change in temperature of the overall system from an "off" state to an equilibrium "on" state, or to account for changes in temperature of the surroundings. In other embodiments, the first set of drive currents are provided within a time in excess of two hours from each other, e.g., at least one day, at least 2 days, at least a week, or even at least a month. In such cases, the drive current can be adjusted for example, to compensate for a change in temperature of the surroundings, or a change in the overall thermal characteristics of the amplifier system due to age.

The optical fiber amplifiers and methods described herein can be configured to operate over a broad range of temperatures, even without active cooling. For example, in certain embodiments, for any temperature measured by the one or more temperature sensors over a temperature range of 20° C. (i.e., from minimum temperature to maximum temperature), the control system is configured to provide to each of the grating-locked diode lasers a range of drive currents for which the gain bandwidth of the diode remains in substantial overlap with the spectral width of the grating. In certain such embodiments, for any temperature measured by the one or more temperature sensors over a temperature range of 25° C., a temperature range of 30° C., a temperature range of 35° C., or even a temperature range of 40° C., the control system is configured to provide to each of the grating-locked diode lasers a range of drive currents for which the gain bandwidth of the diode remains in substantial overlap with the spectral width of the grating. Examples of such temperature ranges include, e.g., from 0 to 20° C., from 0 to 25° C., from 0 to 30° C., from 0 to 35° C., from 0 to 40° C., from 5 to 25° C., from 5 to 30° C., from 5 to 35° C., from 5 to 40° C., from 5 to 45° C., from 10 to 30° C., from 10 to 35° C., from 10 to 40° C., from 10 to 45° C., from 10 to 50° C., from 15 to 35° C., from 15 to 40° C., from 15 to 45° C., from 15 to 50° C., from 15 to 55° C., from 20 to 40° C., from 20 to 45° C., from 20 to 50° C., from 20 to 55° C., from 20 to 60° C., from 25 to 45° C., from 25 to 50° C., from 25 to 55° C., from 25 to 60° C., from 25 to 65° C., from 30 to 50° C., from 30 to 55° C., from 30 to 60° C., from 30 to 65° C., from 30 to 70° C., from 35 to 55° C., from 35 to 60° C., from 35 to 65° C., from 35 to 70° C., from 40 to 60° C., from 40 to 65° C., from 40 to 70° C., from 45 to 65° C., from 45 to 70° C., and from 50 to 70° C.

As the person of ordinary skill in the art will appreciate based on the present disclosure, because there are ranges of acceptable drive currents for a given diode laser at a given temperature, there may be a number of acceptable combinations of drive currents and activated diode lasers that provides the desired output power. The controller can be configured to, based on the measured temperature(s) and the desired power output, select any such combination of diode lasers and drive currents.

As the person of ordinary skill in the art will appreciate, the active optical fiber can in certain embodiments amplify seed radiation that is externally provided. Accordingly, in certain embodiments, the optical fiber amplifier further includes a seed source optically coupled to the active optical fiber. The seed source, as the person of ordinary skill in the art will appreciate, is configured to provide radiation within the gain spectrum associated with the active dopant of the active optical fiber. For example, the system of FIG. 6 includes seed source 670, coupled to the first end 612 of the active optical fiber through optical fiber 637 and coupler 635. The seed source can be, for example, a laser source (e.g., a fiber laser or a solid-state laser), such as in the conventional master oscillator/power amplifier (MOPA) architecture. Similarly, the method can include providing seed radiation to the active optical fiber. In other embodiments, however, no seed radiation is provided, and the active optical fiber amplifies luminescence from spontaneous emission in the active optical fiber.

The person of ordinary skill in the art is familiar with rare earth-doped active optical fibers and will recognize that a variety of such fibers can be used in the methods and amplifiers of the present disclosure. For example, in certain embodiments, the active optical fiber can be a double-clad or triple-clad active optical fiber, as is conventional in the art. The person of ordinary skill in the art will select a desired rare earth dopant depending on the desired wavelength output. In certain embodiments of the amplifiers and methods as otherwise described herein, the rare earth dopant is ytterbium. In other embodiments of the amplifiers and methods as otherwise described herein, the rare earth dopant is erbium. In certain embodiments of the amplifiers and methods as otherwise described herein, the rare earth dopant is a combination of ytterbium and erbium. In certain embodiments of the amplifiers and methods as otherwise described herein, the rare earth dopant is thulium. The person of ordinary skill in the art will appreciate that other rare earth dopants, e.g., neodymium or holmium, can alternatively be used.

The person of ordinary skill in the art is familiar with grating-locked diode lasers and their use in pumping optical fiber amplifiers. The diode lasers can be provided in any desired number, based on the desired power requirements, taking into account the considerations described herein with respect to driving at lower power at high temperatures. In certain embodiments, there are at least four, at least six, at least eight, or at least ten diode lasers. The diode lasers can be conveniently coupled to the active optical fiber conveniently using optical fibers and couplers, as is conventional. The person of ordinary skill in the art will appreciate, however, that other types of connections, including free space optics, can be used to couple the radiation from the diode lasers to the active optical fiber. The person of ordinary skill in the art will appreciate that the particular diode lasers used will depend on the type of active optical fiber used, i.e., such that the output of the diode laser can substantially overlap with the absorption band associated with the active dopant of the active optical fiber. For example, when the active optical fiber has ytterbium as its active dopant, the diode lasers desirably output at a wavelength of about 975 nm.

Figure 9:
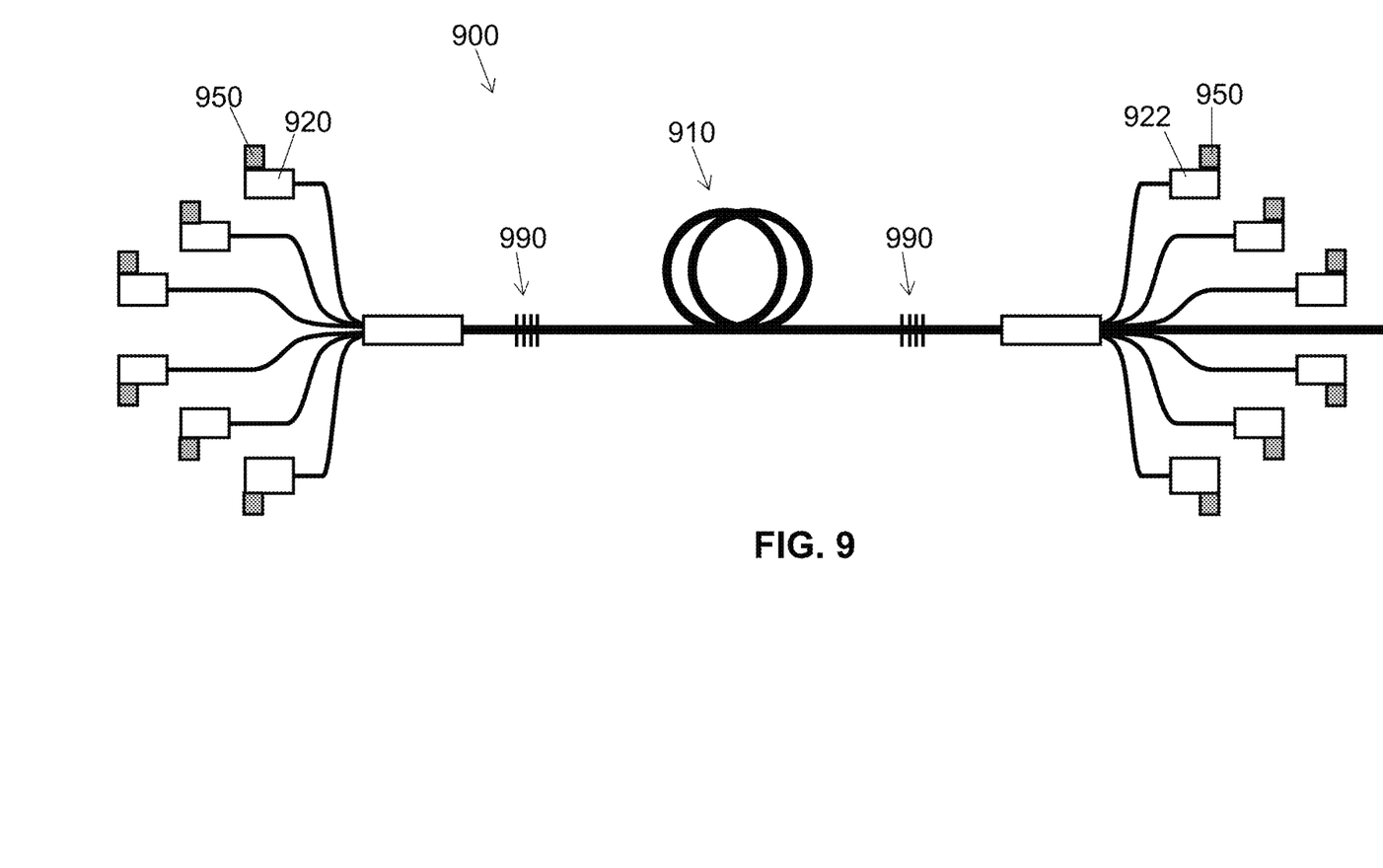
FIG. 9 is a schematic view of an optical fiber amplifier according to another embodiment of the disclosure.

While the embodiment of FIG. 6 is shown as a co-pumped single-pass amplifier, the person of ordinary skill in the art will appreciate that the methods and systems described herein can be configured in a variety of ways. For example, in various embodiments, the amplifier can be configured as a single-pass amplifier as in FIG. 6, or alternatively as a fiber laser, with partially reflective fiber Bragg gratings defining a cavity including a length of the active optical fiber. Similarly, in various embodiments, the amplifier can be provided in a co-pumped configuration (e.g., as in FIG. 6), a counter-pumped configuration, or a co/counter-pumped configuration (i.e., with both co- and counter-pumping). As one example, FIG. 9 is a partial schematic view of an optical fiber amplifier according to another embodiment of the disclosure. For the sake of simplicity, the diode drivers and controller are not shown in this view. In FIG. 9, optical fiber amplifier 900 is configured as a co/counter-pumped optical fiber laser, with diode lasers 920 in a co-pumped configuration, and diode lasers 922 in a counter-pumped configuration. The optical fiber amplifier is configured as a fiber laser, with partially reflective fiber Bragg gratings 990 defining a cavity including a length of the active optical fiber 910, as is conventional. Here, there is no seed source; the amplifier is configured to amplify spontaneous emission in the active optical fiber. Moreover, in this embodiment, there is a temperature sensor 950 associated with each of the diode lasers 922, 924. This can allow for individual temperature measurements, especially useful in cases where different parts of the system will experience different temperatures.

The person of ordinary skill in the art will also understand that other optical devices, such as isolators, polarization controllers, signal monitors, cladding mode strippers, etc., can be included in the optical fiber systems of the present invention. For purposes of clarity, such devices are generally not depicted in the Figures. However, the system of FIG. 6 is depicted as including a cladding mode stripper 680 and an angled endcap 685.

As an illustration, a conventional amplifier can operate with 18 single emitter (unlocked) diode lasers, with each diode laser outputting 150 W of power at 976 nm, providing a total pump power of 2.7 kW. This corresponds to about 2.3 kW of output power at about 1 a micron wavelength in a Yb-doped fiber amplifier (about 85% pump conversion efficiency). Unlocked diode outputs have typical spectral bandwidths in the range of 4-6 nm (full-width at half-maximum), and the spectral shift with temperature is on the order of 0.4 nm/° C. See FIGS. 1-3. As a result, the operating temperature of such diodes need to be within about a ±2° C. window of the nominal operating temperature of 25° C. to maintain system performance. If the operating temperature changes, the diode spectrum will shift in wavelength, away from the Yb absorption spectrum, causing the absorption of the pump energy in the active optical fiber to decrease, thereby decreasing the output power from the amplifier. With a grating-locked diode laser, the operating range can be increased to ±10° C., for the reasons described above. But at more extreme temperatures, the diode laser will not lock all the output power at high or at low currents. As described herein, by operating within a narrower range of operating currents with different ranges at different temperatures, the effective temperature range of the system can be increased, even without active cooling. To make up for the lower output per diode laser at higher temperatures, the system can include more diode lasers to achieve a total desired pump power. While the use of more diode lasers does add cost and complexity, such cost and complexity are outweighed by the ability to forego active cooling, especially considering that state-of-the art diode lasers (even at 150 W of power) are relatively small and light, compared to state-of-the art chillers and their coolants. Moreover, risk of a damaging system failure is greatly decreased when liquid coolants are not required.

In an illustration of certain systems and methods according to the disclosure, 150 W Coherent/Dilas PM16 VBG-locked diodes are used, each generating nominally 150 W at 12 A drive current at a nominal operating temperature of 25° C. The data in FIG. 7 demonstrate that 12 A at 25° C. provides for adequate locking. At 35° C., 11 A provides adequate locking; this can deliver 134 W output power. At 45° C., the upper limit of drive currents for which locking is demonstrated is about 10 A, providing 114 W of output power. And at 55° C., the upper limit of drive current is about 9 A, providing about 90 W of output power. Notably, as the temperature increases, the efficiency of the diode decreases, so output is not linear with drive current. But as the temperature increases, the total locked power available from a given number of diode lasers will decrease.

Increasing the number of diode lasers allows for the maintenance of a desired output power from the systems and methods described herein over a wider temperature range. For example, to match the 2.3 kW output power at 25° C. described above, 24 diode lasers operating at 10 A (i.e., ~114 W each) and 45° C. can be used. This can allow operation up to about 3 kW at 25° C. (i.e., 24×150 W×~85%). But the system can also be run at 2.3 kW amplifier output power using only 9 A (~114 W each at 25° C.) of drive current per diode laser. On the lower temperature side, at 10° C., 18 of the 24 diodes can be drive at 12 A current (150 W each), to provide a 2.3 kW of output power for the amplifier. Accordingly, the system can be operated over a wide temperature range of 10-45° C., even without active cooling.

For the system described above, an even wider temperature range can be achieved for a lower amplifier output power. For the 24 diode laser configuration, the system can be driven as described in the table below to provide nearly 2 kW output over a temperature range of 10-55° C.:

| Temperature | Number of diode lasers used | Drive current | Pump power per source | Total pump power | Total output power |
|---|---|---|---|---|---|
| 10° C. | 16 | 12 A | 150 W | 2.4 kW | 2 kW |
| 25° C. | 24 | 8 A | 100 W | 2.4 kW | 2 kW |
| 35° C. | 24 | ~8.5 A | 100 W | 2.4 kW | 2 kW |
| 45° C. | 24 | 9 A | 100 W | 2.4 kW | 2 kW |
| 55° C. | 24 | 9 A | 90 W | 2.16 kW | 1.86 kW |

In this example, at 55° C. the system is not quite able to provide 2 kW output power. But based on the disclosure herein, the person of ordinary skill in the art would appreciate that three more pump diodes would be sufficient to make up the power difference.

While the systems and methods have been described herein with respect to the use of diode lasers as the pump sources, it will be appreciated that other pump sources can be used, especially those that experience significant spectral drift with changes in drive current and temperature.

Additional aspects of the disclosure are provided by the following enumerated embodiments, the features of which can be combined and permuted in any number and any combination that is not logically or technically inconsistent.

Embodiment 1. An optical fiber system configured to provide amplified radiation, the system comprising:
an active optical fiber having an active dopant, an absorption spectrum associated with the active dopant, the active optical fiber having a first end and a second end;
a plurality of grating-locked pump sources arranged to pump the active optical fiber, each grating-locked pump source having a gain bandwidth and a grating having a spectral width, each grating-locked pump source having an output optically coupled to the first end or the second end of the active optical fiber, each grating-locked pump source being configured to output pump radiation having a spectrum that substantially overlaps with the absorption spectrum associated with the active dopant of the active optical fiber, the pump radiation having a power that depends on a drive current input to the grating-locked pump source;
one or more temperature sensors, configured to measure a temperature associated with one or more of the grating-locked pump sources; and
a control system configured to accept measurements from the one or more temperature sensors and, for a desired total pump power output, to provide to one or more of the grating-locked pump sources a set of drive currents suitable to provide the desired total pump power output, wherein for each of the one or more pump sources to which current is to be provided, the drive current is controllable such that, based on the measured temperature associated with that pump source,
the gain bandwidth of the grating-locked pump source remains in substantial overlap with the spectral width of the grating, and
the pump radiation output by the pump source has a spectrum that substantially overlaps with the absorption spectrum associated with the active dopant of the active optical fiber.

Embodiment 2. The optical fiber system according to embodiment 1, wherein the controller is configured to, depending on the measured temperature(s) and the desired total pump power output, determine how many of the grating-locked pump sources to activate and to provide substantial current only to those pump sources.

Embodiment 3. The optical fiber system according to embodiment 2, wherein the controller is configured to, depending on the measured temperature(s) and the desired total pump power output, determine how many of the grating-locked pump sources to activate and to provide current of at least 1 A only to those pump sources.

Embodiment 4. The optical fiber system according to embodiment 2 or embodiment 3, wherein the controller is configured to, depending on the measured temperature(s) and the desired total pump power output, determine how many of the grating-locked pump sources to activate and to provide, only to each such pump source, current of at least 20% of the maximum rated power of that pump source.

Embodiment 5. The optical fiber system according to any of embodiments 2-4, wherein the same grating-locked pump source or sources are not selected each time the system is used as being those to which substantially no current will be provided.

Embodiment 6. The optical fiber system according to any of embodiments 1-5, wherein the plurality of grating-locked pump sources are disposed on a baseplate, and wherein the optical fiber amplifier includes at least one temperature sensor configured to measure at least one temperature of the baseplate to provide the temperature measurement associated with one or more of the grating-locked pump sources.

Embodiment 7. The optical fiber system according to any of embodiments 1-6, further including a plurality of temperature sensors, with different temperature sensors configured to provide temperature measurements associated with different grating-locked pump sources.

Embodiment 8. The optical fiber system according to any of embodiments 1-7, lacking a thermoelectric chiller in substantial thermal contact with the grating-locked pump sources.

Embodiment 9. The optical fiber system according to any of embodiments 1-8, lacking a liquid chiller in substantial thermal contact with the grating-locked pump sources.

Embodiment 10. The optical fiber system according to any of embodiments 1-9, not configured to have substantial airflow in substantial thermal contact with the one or more grating-locked pump sources.

Embodiment 11. The optical fiber system according to any of embodiments 1-7, wherein the grating-locked pump sources are not configured to be actively cooled.

Embodiment 12. The optical fiber system according to any of embodiments 1-11, wherein for each of the grating-locked pump sources, the control system is configured to provide a first range of drive currents to the grating-locked pump source at a first measured temperature, and to provide a second range of drive currents to the grating-locked pump source at a second measured temperature 20° C. more than the first measured temperature, the second range of drive currents being substantially different from the second range of drive currents.

Embodiment 13. The optical fiber system according to any of embodiments 1-11, wherein for each of the grating-locked pump sources, the control system is configured to provide a first range of drive currents to the grating-locked pump source at a first measured temperature, and to provide a second range of drive currents to the grating-locked pump source at a second measured temperature 30° C. more than the first measured temperature, the second range of drive currents being substantially different from the second range of drive currents.

Embodiment 14. The optical fiber system according to embodiment 12 or embodiment 13, wherein the second range of drive currents has a substantially lower (e.g., at least 5% lower or at least 10% lower) maximum current, a substantially lower (e.g., at least 5% lower or at least 10% lower) minimum current, or both a substantially lower (e.g., at least 5% lower or at least 10% lower) maximum current and a substantially lower minimum current than the first range of drive currents.

Embodiment 15. The optical fiber system according to any of embodiments 1-14, wherein, for any temperature measured by the one or more temperature sensors over a temperature range of 20° C., the control system is configured to provide to each of the grating-locked pump sources a range of drive currents for which the gain bandwidth of the grating-locked pump source remains in substantial overlap with the spectral width of the grating.

Embodiment 16. The optical fiber system according to any of embodiments 1-14, wherein for any temperature measured by the one or more temperature sensors over a temperature range of 25° C., a temperature range of 30° C., a temperature range of 35° C., or even a temperature range of 40° C., the control system is configured to provide to each of the grating-locked pump sources a range of drive currents for which the gain bandwidth of the grating-locked pump source remains in substantial overlap with the spectral width of the grating.

Embodiment 17. The optical fiber system according to any of embodiments 1-14, wherein for any temperature measured by the one or more temperature sensors over a temperature range of from 0 to 20° C., from 0 to 25° C., from 0 to 30° C., from 0 to 35° C., from 0 to 40° C., from 5 to 25° C., from 5 to 30° C., from 5 to 35° C., from 5 to 40° C., from 5 to 45° C., from 10 to 30° C., from 10 to 35° C., from 10 to 40° C., from 10 to 45° C., from 10 to 50° C., from 15 to 35° C., from 15 to 40° C., from 15 to 45° C., from 15 to 50° C., from 15 to 55° C., from 20 to 40° C., from 20 to 45° C., from 20 to 50° C., from 20 to 55° C., from 20 to 60° C., from 25 to 45° C., from 25 to 50° C., from 25 to 55° C., from 25 to 60° C., from 25 to 65° C., from 30 to 50° C., from 30 to 55° C., from 30 to 60° C., from 30 to 65° C., from 30 to 70° C., from 35 to 55° C., from 35 to 60° C., from 35 to 65° C., from 35 to 70° C., from 40 to 60° C., from 40 to 65° C., from 40 to 70° C., from 45 to 65° C., from 45 to 70° C., and from 50 to 70° C., the control system is configured to provide to each of the grating-locked pump sources a range of drive currents for which the gain bandwidth of the grating-locked pump source remains in substantial overlap with the spectral width of the grating.

Embodiment 18. A method for providing amplified radiation from an optical fiber system including an active optical fiber having an active dopant and a plurality of grating-locked pump sources arranged to pump the optical fiber, said method comprising:
providing a total pump power to the active optical fiber by
measuring a temperature associated with each of one or more of the grating-locked pump sources; and
for each of the one or more grating-locked pumped sources, based on the measured temperature associated with that pump source, providing a drive current to the grating-locked pump source, the drive current being selected such that
the gain bandwidth of the grating-locked remains in substantial overlap with the spectral width of the grating, and
the pump radiation output by the pump source has a spectrum that substantially overlaps with the absorption spectrum associated with the active dopant of the active optical fiber,
wherein the set of drive currents are selected to provide the total pump power to the active optical fiber from the one or more grating-locked pump sources; and
amplifying radiation in the active optical fiber to provide the amplified radiation.

Embodiment 19. The method according to embodiment 18, wherein the method includes, based on the total pump power to be provided to the active optical fiber and the measured temperature(s), determining how many of the pump sources are to be activated, and providing substantial current only to those pump sources.

Embodiment 20. The method according to embodiment 19, wherein current of at least 1 A is provided only to the pump sources that are determined to be activated.

Embodiment 21. The method according to embodiment 19 or embodiment 20, wherein current of at least 20% of the maximum rated power is provided only to the pump sources that are determined to be activated.

Embodiment 22. The method according to any of embodiments 19-21, wherein the same pump source or sources are not selected each time the system is used as being those to which substantially no current will be provided.

Embodiment 23. The method according to any of embodiments 18-22, wherein a single temperature measurement is associated with each of the pump sources.

Embodiment 24. The method according to any of embodiments 18-23, wherein a plurality of temperature measurements are made, with different measurements being associated with different pump sources.

Embodiment 25. The method according to any of embodiments 18-24, wherein the grating-locked pump sources are not actively cooled.

Embodiment 26. The method according to any of embodiments 18-25, wherein the grating-locked pump sources are not substantially cooled by a thermoelectric chiller.

Embodiment 27. The method according to any of embodiments 18-26, wherein the grating-locked pump sources are not substantially cooled by a liquid chiller.

Embodiment 28. The method according to any of embodiments 18-27, wherein the grating-locked pump sources are not substantially cooled by a flow of air.

Embodiment 29. The method according to any of embodiments 18-28, wherein the method includes providing a first set of drive currents to a first set of the plurality of pump sources at a first set of measured temperatures associated with the first set of pump sources to provide a first total pump power; and providing a second set of drive currents to a second set of the plurality of pump sources at a second set of measured temperatures associated with the second set of pump sources to provide a second total pump power substantially the same as the first total pump power, one or more of the second set of measured temperatures being at least 10° C. greater (e.g., at least 20° C. greater, or even at least 30° C. greater) than the corresponding temperatures of first set of measured temperatures, and the first set of drive currents being substantially different from the second set of drive currents.

Embodiment 30. The method according to embodiment 29, wherein one or more of (e.g., each of) the drive currents of the first set of drive currents is substantially lower (e.g., at least 5% less or even at least 10% less) than the drive currents of the second set of drive of drive currents.

Embodiment 31. The method according to embodiment 30, wherein there are fewer pump sources having drive current supplied thereto in the first set of pump sources than in the second set of pump sources.

Embodiment 32. The method according to any of embodiments 18-28, wherein the method includes providing a first set of drive currents to a first set of the plurality of pump sources at a first set of measured temperatures associated with the first set of pump sources to provide a first total pump power, then providing a second set of drive currents to a second set of the plurality of pump sources at a second set of measured temperatures associated with the first set of pump sources to provide a second total pump power substantially the same as the first total pump power, one or more of the second set of measured temperatures being at least 10° C. greater (e.g., at least 20° C. greater, or even at least 30° C. greater) than the corresponding temperatures of first set of measured temperatures, and the first set of drive currents being substantially different from the second set of drive currents.

Embodiment 33. The method according to any of embodiments 18-32, performed using the system according to any of embodiments 1-17.

It will be apparent to those skilled in the art that various modifications and variations can be made to the processes and devices described here without departing from the scope of the disclosure. Thus, it is intended that the present disclosure cover such modifications and variations of this invention provided they come within the scope of the appended claims and their equivalents.

What is claimed is:

1. A method for providing amplified radiation from an optical fiber system including an active optical fiber having an active dopant and a plurality of grating-locked pump sources arranged to pump the optical fiber, said method comprising:
   providing a total pump power to the active optical fiber by measuring a temperature associated with each of one or more of the grating-locked pump sources; and
   for each of the one or more grating-locked pump sources, based on the measured temperature associated with that grating-locked pump source, providing a drive current to the grating-locked pump source, the drive current being selected such that
      the gain bandwidth of the grating-locked pump source remains in substantial overlap with the spectral width of the grating, and
      the pump radiation output by the grating-locked pump source has a spectrum that substantially overlaps with the absorption spectrum associated with the active dopant of the active optical fiber,
   wherein the drive currents are selected to provide the total pump power to the active optical fiber from the one or more grating-locked pump sources; and
   amplifying radiation in the active optical fiber to provide the amplified radiation, wherein the method includes providing, at a first time, a first set of drive currents to a first set of the plurality of grating-locked pump sources at a first set of measured temperatures associated with the first set of grating-locked pump sources to provide a first total pump power; and providing, at a second time different than the first time, a second set of drive currents to a second set of the plurality of grating-locked pump sources at a second set of measured temperatures associated with the second set of grating-locked pump sources to provide a second total pump power substantially the same as the first total pump power, one or more of the second set of measured temperatures being at least 10° C. greater than the corresponding temperatures of first set of measured temperatures, and the first set of drive currents being substantially different from the second set of drive currents.

2. The method according to claim 1, wherein the method includes, based on the total pump power to be provided to the active optical fiber and the measured temperature(s), determining how many of the grating-locked pump sources are to be activated, and providing current of at least 1 A only to those grating-locked pump sources.

3. The method according to claim 1, wherein the method includes, based on the total pump power to be provided to the active optical fiber and the measured temperature(s), determining how many of the grating-locked pump sources are to be activated, and providing current of at least 20% of the maximum rated power only to those grating-locked pump sources.

4. The method according to claim 1, wherein the same grating-locked pump source or sources are not selected each time the system is used as being those to which substantially no current will be provided.

5. The method according to claim 1, wherein a single temperature measurement is associated with each of the grating-locked pump sources.

6. The method according to claim 1, wherein a plurality of temperature measurements are made, with different measurements being associated with different grating-locked pump sources.

7. The method according to claim 1, wherein the grating-locked pump sources are not actively cooled.

8. The method according to claim 1, wherein one or more of the second set of measured temperatures is at least 20° C. greater than the corresponding temperatures of the first set of measured temperatures.

9. The method according to claim 8, wherein each of the drive currents of the first set of drive currents is at least 10% less than the drive currents of the second set of drive of drive currents.

10. The method according to claim 9, wherein there are fewer grating-locked pump sources having drive current supplied thereto in the first set of grating-locked pump sources than in the second set of pump sources.

11. The method according to claim 1, wherein each of the drive currents of the first set of drive currents is at least 5% less than the drive currents of the second set of drive of drive currents.

12. An optical fiber system configured to provide amplified radiation, the system comprising:
an active optical fiber having an active dopant, an absorption spectrum associated with the active dopant, the active optical fiber having a first end and a second end;
a plurality of grating-locked pump sources arranged to pump the active optical fiber, each grating-locked pump source having a gain bandwidth and a grating having a spectral width, each grating-locked pump source having an output optically coupled to the first end or the second end of the active optical fiber, each grating-locked pump source being configured to output pump radiation having a spectrum that substantially overlaps with the absorption spectrum associated with the active dopant of the active optical fiber, the pump radiation having a power that depends on a drive current input to the grating-locked pump source;
one or more temperature sensors, configured to measure a temperature associated with one or more of the grating-locked pump sources; and
a control system configured to accept measurements from the one or more temperature sensors and, for a desired total pump power output, to provide to one or more of the grating-locked pump sources a set of drive currents suitable to provide the desired total pump power output, wherein for each of the one or more grating-locked pump sources to which current is to be provided, the drive current is controllable such that, based on the measured temperature associated with that grating-locked pump source,
the gain bandwidth of the grating-locked pump source remains in substantial overlap with the spectral width of the grating,
wherein for each of the grating-locked pump sources, the control system is configured to provide a first range of drive currents to the grating-locked pump source at a first measured temperature, and to provide a second range of drive currents to the grating-locked pump source at a second measured temperature at least 10° C. more than the first measured temperature, the second range of drive currents being substantially different from the first range of drive currents, wherein the second range of drive currents has a substantially lower maximum current, a substantially lower minimum current, or both a substantially lower maximum current and a substantially lower minimum current than the first range of drive currents.

13. The optical fiber system according to claim 12, wherein the controller is configured to, depending on the measured temperature(s) and the desired total pump power output, determine how many of the grating-locked pump sources to activate and to provide current of at least 1 A and of at least 20% of the maximum rated power of that grating-locked pump source only to those grating-locked pump sources.

14. The optical fiber system according to claim 12, wherein the same grating-locked pump source or sources are not selected each time the system is used as being those to which substantially no current will be provided.

15. The optical fiber system according to claim 12, wherein the plurality of grating-locked pump sources are disposed on a baseplate, and wherein the optical fiber amplifier includes at least one temperature sensor configured to measure at least one temperature of the baseplate to provide the temperature measurement associated with one or more of the grating-locked pump sources.

16. The optical fiber system according to claim 12, further including a plurality of temperature sensors, with different temperature sensors configured to provide temperature measurements associated with different grating-locked pump sources.

17. The optical fiber system according to claim 12, lacking a thermoelectric chiller in substantial thermal contact with the grating-locked pump sources, lacking a liquid chiller in substantial thermal contact with the grating-locked pump sources, and not configured to have substantial airflow in substantial thermal contact with the one or more grating-locked pump sources.

18. The optical fiber system according to claim 12, wherein the second measured temperature is at least 30° C. more than the first measured temperature, the second range of drive currents being substantially different from the second range of drive currents, wherein the second range of drive currents has an at least 10% lower maximum current, an at least 10% lower minimum current, or both an at least 10% lower maximum current and an at least 10% lower minimum current than the first range of drive currents.

19. The optical fiber system according to claim 12, wherein, for any temperature measured by the one or more temperature sensors over a temperature range of 20° C., the control system is configured to provide to each of the grating-locked pump sources a range of drive currents for which the gain bandwidth of the grating-locked pump source remains in substantial overlap with the spectral width of the grating.

20. The optical fiber system according to claim 12, wherein for any temperature measured by the one or more temperature sensors over a temperature range of 30° C., the control system is configured to provide to each of the grating-locked pump sources a range of drive currents for which the gain bandwidth of the grating-locked pump source remains in substantial overlap with the spectral width of the grating.

21. A method for providing amplified radiation form an optical fiber system including an active optical fiber having an active dopant and a plurality of grating-locked pump sources, the grating-locked pump sources being substantially identical to one another, arranged to pump the optical fiber, said method comprising, at a first time,
providing a total pump power to the active optical fiber by measuring a temperature associated with each of one or more of the grating-locked pump sources;
based on the total pump power to be provided to the active optical fiber and the measured temperature(s), determining how many of the grating-locked pump sources are to be activated, and selected a set of the grating-locked pump sources to be activated and at least one grating-locked pump source to not be activated;

refraining from providing substantial drive current to the at least one grating-locked pump source to not be activated; and based on the measured temperature associated with each grating-locked pump source to be activated, providing a drive current thereto, the drive current being selected such that the gain bandwidth of the grating-locked pump source to be activated remains in substantial overlap with the spectral width of the grating, and the pump radiation output by the grating-locked pump source to be activated has a spectrum that substantially overlaps with the absorption spectrum associated with the active dopant of the active optical fiber, wherein the drive currents are selected to provide the total pump power to the active optical fiber from the one or more grating-locked pump sources; and amplifying radiation in the active optical fiber to provide the amplified radiation.

22. The method according to claim 21, wherein at the first time, for each of the grating-locked pump sources to be activate the drive current provided is at least 1 A and at least 20% of a maximum rated power of the grating-locked pump source.

23. The method according to claim 21, further comprising at a second time different from the first time, providing a total pump power to the active optical fiber by measuring a temperature associated with each of one or more of the grating-locked pump sources;

based on the total pump power to be provided to the active optical fiber and the measured temperature(s), determining how many of the grating-locked pump sources are to be activated, and selecting a set of the grating-locked pump sources to be activated; and based on the measured temperature associated with each grating-locked pump source to be activated, providing a drive current thereto, the drive current being selected such that the gain bandwidth of the grating-locked pump source to be activated remains in substantial overlap with the spectral width of the grating, and the pump radiation output by the grating-locked pump source to be activated has a spectrum that substantially overlaps with the absorption spectrum associated with the active dopant of the active optical fiber; and amplifying radiation in the active optical fiber to provide the amplified radiation, wherein the total pump power provided to the active optical fiber at the second time is substantially the same as the total pump power provided to the active optical fiber as the first time, the temperature(s) measured at the second time are substantially different from the temperature(s) measured at the first time, and a number of the grating-locked pump sources activated at the first time is different from a number of the grating-locked pump sources activated at the second time.

* * * * *